(12) United States Patent
Lee

(10) Patent No.: US 7,615,790 B2
(45) Date of Patent: Nov. 10, 2009

(54) ORGANIC LIGHT-EMITTING DISPLAY DEVICE AND METHOD OF MANUFACTURING THE SAME

(75) Inventor: Jun-Yeob Lee, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 333 days.

(21) Appl. No.: 11/514,779

(22) Filed: Aug. 31, 2006

(65) Prior Publication Data

US 2007/0075310 A1 Apr. 5, 2007

(30) Foreign Application Priority Data

Sep. 30, 2005 (KR) .................. 10-2005-0092144

(51) Int. Cl.
*H01L 27/15* (2006.01)
(52) U.S. Cl. .................. 257/79; 257/59; 257/40; 257/89; 428/690
(58) Field of Classification Search .......... 257/79, 257/59, 40, 89; 428/690
See application file for complete search history.

(56) References Cited

U.S. PATENT DOCUMENTS

| 5,703,436 | A | * | 12/1997 | Forrest et al. .............. 313/506 |
| 6,541,130 | B2 | * | 4/2003 | Fukuda .................. 428/690 |
| 6,627,333 | B2 | | 9/2003 | Hatwar |
| 7,019,331 | B2 | * | 3/2006 | Winters et al. ............ 257/79 |
| 7,057,339 | B2 | * | 6/2006 | Boroson et al. ........... 313/504 |
| 2005/0249972 | A1 | * | 11/2005 | Hatwar et al. ............ 428/690 |

FOREIGN PATENT DOCUMENTS

| JP | 2005-38784 | 2/2005 |
| KR | 10-2003-0015870 | 2/2003 |
| KR | 10-2004-0104225 | 12/2004 |
| KR | 10-2005-0027467 | 3/2005 |
| KR | 10-2005-0028564 | 3/2005 |

\* cited by examiner

*Primary Examiner*—Samuel A Gebremariam
(74) *Attorney, Agent, or Firm*—Knobbe Martens Olson & Bear LLP

(57) ABSTRACT

Provided is an organic light-emitting display device that can display a full color image by forming a simple structure of light-emitting layers and a method of manufacturing the same. The organic light-emitting display device includes a substrate; a first electrode layer formed on the substrate; a second electrode layer which is formed above the first electrode layer and faces the first electrode layer; and a light-emitting layer interposed between the first electrode layer and the second electrode layer, wherein the light-emitting layer comprises first and second light-emitting layers respectively corresponding to first and second pixels having different colors from each other, and the first light-emitting layer is commonly formed in the first and second pixels, and the second light-emitting layer is formed in the second pixel.

13 Claims, 3 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2005-0092144, filed on Sep. 30, 2005, in the Korean Intellectual Property Office, the disclosure of which is incorporated herein in its entirety by reference.

BACKGROUND OF THE INVENTION

1. Field of the Invention

The present invention relates to an organic light-emitting display device and a method of manufacturing the same, and more particularly, to an organic light-emitting display device that can readily realize a full color image and a method of manufacturing the same using a simplified mask patterning process.

2. Description of the Related Technology

An organic light-emitting display device has a structure in which a light-emitting layer is interposed between an anode electrode and a cathode electrode, and realizes a full color image by forming the light-emitting layer to realize red, green, and blue color, or yellow, magenta, and cyan color for emitting white color, etc.

The light-emitting layer of an organic light-emitting display device must be patterned with pixels composed of the above colors. However, the patterning process of the light-emitting layer is very difficult since the light-emitting layer is very sensitive to moisture and oxygen.

A simple method of patterning the light-emitting layer involves depositing the light-emitting layer using masks in which a region corresponding to a pixel of a specific color is opened and regions corresponding to pixels of other colors are shielded.

However, in this method, each color needs a patterned mask. That is, many patterned masks are required corresponding to the number of colors, thereby increasing manufacturing costs.

SUMMARY OF CERTAIN INVENTIVE ASPECTS

One aspect of the invention provides an organic light-emitting display device that can realize a full color image by simplifying a mask patterning process of a light-emitting layer and a method of manufacturing the same.

Another aspect of the invention provides an organic light-emitting display device comprising: an array of pixels comprising a first pixel, a second pixel and a third pixel; a first light-emitting layer common in the first, second and third pixels, the first light-emitting layer comprising a first light-emitting material; a second light-emitting layer common in the second and third pixels, the second light-emitting layer comprising a second light-emitting material differing from the first light-emitting material, wherein the first pixel does not comprise the second light-emitting layer; and a third light-emitting layer in the third pixel, the third light-emitting layer comprising a third light-emitting material differing from the first and second light-emitting materials, wherein the first and second pixels do not comprise the third light-emitting layer.

In the third pixel of the device, the second light-emitting layer may be interposed between the first and third light-emitting layers. The second light-emitting layer may contact the first light-emitting layer, and the third light-emitting layer may contact the second light-emitting layer. The first, second and third light-emitting materials may be selected from the group consisting of blue (B), green (G) and red (R) light-emitting materials. The first pixel may be configured to emit blue light. The second pixel may be configured to emit green light, and the third pixel may be configured to emit red light.

Each of the first, second and third pixels may comprise an anode and a cathode. At least one of the anode and cathode may be at least partially transparent. Each of the first, second and third pixels may further comprise at least one layer between the anode and the first light-emitting layer, and the at least one layer may be selected from the group consisting of a hole injection layer (HIL) and a hole transport layer (HTL). Each of the first, second and third pixels may further comprise at least one layer between the cathode and the first light-emitting layer, and the at least one layer may be selected from the group consisting of an electron injection layer (EIL) and an electron transport layer (ETL).

Yet another aspect of the invention provides a method of making an organic light-emitting display device. The method comprises: providing an intermediate device comprising an array of pixel regions, the array comprising first, second and third pixel regions, the array further comprising partitioning walls partitioning the pixel regions of the array; forming a first light-emitting layer over the first, second and third pixel regions, the first light-emitting layer comprising a first light-emitting material; forming a second light-emitting layer over the second and third pixel regions, the second light-emitting layer comprising a second light-emitting material differing from the first light-emitting material, wherein the second light-emitting layer does not extend over the first pixel region; and forming a third light-emitting layer over the third pixel region, the third light-emitting layer comprising a third light-emitting material differing from the first and second light-emitting materials, wherein the third light-emitting layer does not extend over the first and second pixel regions.

The first light-emitting layer may be formed over the array of pixel regions substantially throughout. Forming the first, second and third light-emitting layers may comprise using no more than two masks. Forming the second light-emitting layer may comprise depositing the second light-emitting material through a mask selectively blocking the first pixel region and selectively opening the second and third pixel regions. Forming the third light-emitting layer may comprise depositing the third light-emitting material through a mask selectively blocking the first and second pixel regions and selectively opening the third pixel region.

The second light-emitting layer may be formed directly on the first light-emitting layer, and the third light-emitting layer may be formed directly on the second light-emitting layer. The first, second and third light-emitting layers may comprise blue (B), green (G) and red (R) light-emitting materials, respectively.

Another aspect of the invention provides a method of emitting light, comprising: providing the organic light-emitting display device described above; injecting holes from the anode toward the third light-emitting layer of the third pixel, wherein the holes travel through the first and second light-emitting layers to reach the third light-emitting layer of the third pixel; injecting electrons from the cathode toward the third light-emitting layer; and emitting light from the third light-emitting layer of the third pixel when the holes and electrons meet therein. The first, second and third light-emitting layers may comprise blue (B), green (G) and red (R) light-emitting materials, respectively, and light emitted from the third pixel may be red.

The method may further comprise: injecting holes from the anode toward the second light-emitting layer of the second pixel, wherein the holes travel through the first light-emitting layers to reach the second light-emitting layer of the second pixel; injecting electrons from the cathode toward the second light-emitting layer; and emitting light from the second light-emitting layer of the second pixel when the holes and electrons meet therein. The first and second light-emitting layers may comprise blue (B) and green (G) light-emitting materials, respectively, and light emitted from the second pixel may be green.

Another aspect of the invention provides an organic light-emitting display device. The device includes a substrate; a first electrode layer formed on the substrate; a second electrode layer which is formed above the first electrode layer and faces the first electrode layer; and a light-emitting layer interposed between the first electrode layer and the second electrode layer, wherein the light-emitting layer comprises first and second light-emitting layers respectively corresponding to first and second pixels having different colors from each other, the first light-emitting layer is commonly formed in the first and second pixels, and the second light-emitting layer is formed in the second pixel.

Another aspect of the invention provides a method of manufacturing an organic light-emitting display device. The method comprises: forming a first electrode layer on a substrate; forming a light-emitting layer that comprises first and second light-emitting layers respectively corresponding to first and second pixels having different colors from each other on the first electrode layer; and forming a second electrode layer on the light-emitting layer, wherein the forming of the light-emitting layer comprises commonly forming the first light-emitting layer in first and second pixels and forming the second light-emitting layer in the second pixel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

The present invention will now be described more fully with reference to the accompanying drawings in which exemplary embodiments of the invention are shown.

Figure 1:
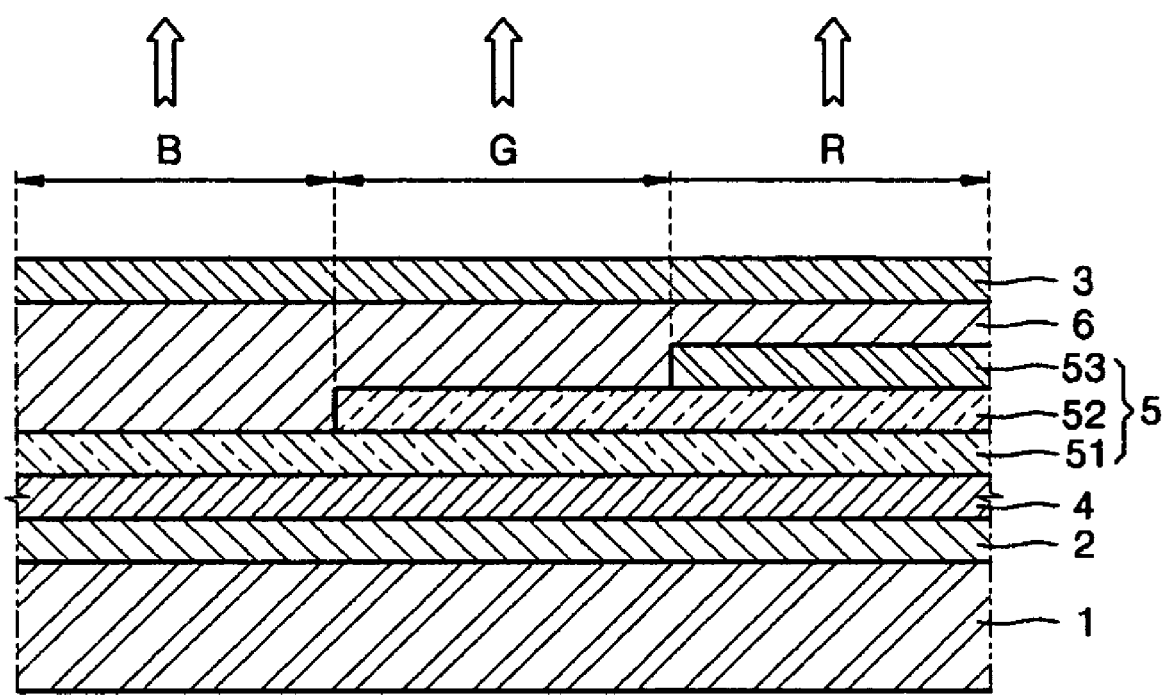
FIG. 1 is a cross-sectional view of an organic light-emitting display device according to an embodiment.

FIG. 1 is a cross-sectional view of an organic light-emitting display device according to an embodiment. Referring to FIG. 1, the organic light-emitting display device includes: a substrate 1; a first electrode layer 2 formed on the substrate 1; a first common layer 4, a light-emitting layer 5, and a second common layer 6 sequentially formed on the first electrode layer 2; and a second electrode layer 3 on the second common layer 6. Although it is not depicted, a sealing member (not shown) such as, glass, film, a metal cap, etc., that shields the organic layers such as the first common layer 4, the light-emitting layer 5, and the second common layer 6 from the outside can further be formed on the second electrode layer 3. A passivation layer can further be interposed between the sealing member and the second electrode layer 3. For convenience of explanation, a structure of an organic light-emitting display device without the sealing member will now be described in the following embodiments.

The substrate 1 can be formed of glass having $SiO_2$ as the main component. Although it is not depicted, a buffer layer for planarizing an upper surface of the substrate 1 and for blocking the penetration of impurity elements can further be included on the upper surface of the substrate 1. The buffer layer can be formed of $SiO_2$ and/or $SiN_x$. The substrate 1 is not limited thereto, and can be formed of a plastic material, or can be a flexible metal plate formed of SUS, W, Ti, etc.

The first electrode layer 2 and the second electrode layer 3 facing the first electrode layer 2 are formed over the substrate 1. Organic films including the light-emitting layer 5 are interposed between the first electrode layer 2 and the second electrode layer 3.

In one embodiment, the first electrode layer 2 can be a reflection electrode. The reflection electrode can have a structure in which, after forming a reflection film using Al, Ag, and/or Ca, a transparent conductive material having a high work function, such as ITO, IZO, $In_2O_3$, and ZnO can be formed. The first electrode layer 2 can be used for an anode electrode.

The second electrode layer 3 can be a transparent electrode. In this case, a semi-transparent film is formed of a high transparency material, such as Mg, Ag, etc. A transparent conductor formed of a material, such as ITO, IZO, $In_2O_3$, and ZnO, can be further be formed on the semi-transparent film. The second electrode layer 3 can be used for a cathode electrode.

Materials for forming the first and second electrode layers 2 and 3 are not limited thereto. In certain embodiments, a paste that includes a conductive polymer or an electric conductive powder can be used so that the first and second electrode layers 2 and 3 can have flexibility.

In the case of a passive matrix (PM) type organic light-emitting display device, the pattern of the first electrode layer 2 can be formed in stripe shapes spaced at a predetermined distance from each other. In the case of an active matrix (AM) type organic light-emitting display device, the pattern of the first electrode layer 2 can be formed in a shape corresponding to pixels. Also, in the AM type organic light-emitting display device, a thin film transistor (TFT) layer having at least one TFT can further be included on a lower part of the first electrode layer 2 on the substrate 1. In such an embodiment, the first electrode layer 2 is electrically connected to the TFT layer. The detailed embodiments of the PM type and AM type organic light-emitting display devices will be described later.

In the case of a PM type organic light-emitting display device, the second electrode layer 3 can be formed in a stripe shape crossing the pattern of the first electrode layer 2. With respect to an AM type device, the second electrode layer 3 can be formed on the entire active region where an image is displayed, which will be described later.

The polarity of the first electrode layer 2 and the second electrode layer 3 may be opposite to each other.

The light-emitting layer 5 is interposed between the first and second electrode layers 2 and 3. The light-emitting layer 5 emits light according to electrical driving of the first and second electrode layers 2 and 3.

The first common layer 4 can be interposed between the first electrode layer 2 and the light-emitting layer 5, and the second common layer 6 can be interposed between the light-emitting layer 5 and the second electrode layer 3.

In one embodiment, the first electrode layer 2 is an anode electrode, and the second electrode layer 3 is a cathode electrode. In such an embodiment, the first common layer 4 can be a hole transport layer and/or a hole injection layer, and the second common layer 6 can be an electron transport layer and/or an electron injection layer. If necessary, the second common layer 6 can further include a hole suppressor layer, and can further include other layers. The first and second common layers 4 and 6 can be formed of low molecular weight organic materials or polymer organic materials, i.e., can be formed of various materials used for forming organic light-emitting display devices.

The hole injection layer can be formed of a low molecular weight organic material, such as CuPc, TNATA, TCTA, and TDAPB, and a polymer, such as PANI and PEDOT. The hole transport layer can be formed of a low molecular weight organic material, such as an arylamine-based low molecule material, a hydrazone-based low molecule material, a stilbene-based low molecule material and a starburst-based low molecule material, for example, NPB, TPD, s-TAD, MTA-DATA, etc., or a polymer such as a carbazole-based polymer, an arylamine-based polymer, a perylene-based polymer and a pyrrol-based polymer, for example, PVK, etc. The first common layer 4 can be formed using a vacuum evaporation or sputtering method.

The hole suppressor layer can be formed of a low molecular weight organic material, such as Balq, BCP, CF-X, TAZ, spiro-TAZ. The electron injection layer can be formed of a low molecular weight organic material, such as Alq3, a gallium compound, and PBD, or a polymer, such as oxadiazole group.

As depicted in FIG. 1, the organic light-emitting display device has a top emission type light-emitting structure, and each pixel includes red, green and blue pixels. In the illustrated embodiment, the light-emitting layer 5 includes a blue light-emitting layer 51, a green light-emitting layer 52, and a red light-emitting layer 53.

The blue light-emitting layer 51 is deposited in an area corresponding to a blue pixel B, a green pixel G, and a red pixel R using a mask for forming the first common layer 4 or the second common layer 6. The blue light-emitting material can be a low molecular weight organic material, such as DPVBi, spiro-DPVBi, spiro-6P, distyrylbenzene (DSB) and distyrylarylene (DSA), or a polymer such as the PFO-based polymer and the PPV-based polymer as a blue light-emitting material.

Next, the green light-emitting layer. 52 is deposited on the blue light-emitting layer 51 in an area corresponding to the green pixel G and the red pixel R using a mask that shields the blue pixel B. The green light-emitting material can be a low molecular weight organic material, such as Alq3, Alq3(host)/C545t(dopant), CBP(host)/IrPPy (phosphorescent organic-metal complex) or a polymer such as the PFO-based polymer and the PPV-based polymer.

Next, the red light-emitting layer 53 is deposited on the green light-emitting layer 52 in an area corresponding to the red pixel R using a mask that shields the blue B and green G pixels. The red light-emitting material can be a low molecular weight organic material, such as Alq3 (host)/DCJTB (fluorescent dopant), Alq3(host)/DCM(fluorescent dopant) and CBP(host)/PtOEP (phosphorescent organic-metal complex), or a polymer such as a PFO-based polymer and a PPV-based polymer.

In the embodiment described above, only two patterned masks, i.e., the green and red masks, for forming the light-emitting layers are required. The mask for forming the blue light-emitting layer 51 may be omitted. Also, the green mask does not need to be a high precision mask since the deposition area is not limited to the green pixel G. Accordingly, the required number of masks can be reduced, thereby reducing manufacturing costs.

The first common layer 4 and the second common layer 6 can be formed to thicknesses suitable for a resonance structure of the blue color. In FIG. 1, the second common layer 6 in each of the blue B, green G and red G pixels has a different thickness, but the thickness in each pixel can be equal.

The organic light-emitting display device shown in FIG. 1 has red, green, and blue color pixels. In other embodiments, the pixels may have different colors, such as yellow, cyan, and magenta. In addition, the illustrated device is a top emission type organic light-emitting display device. In certain embodiments, the device may be a bottom emission type organic light-emitting display device. In such embodiments, the organic light-emitting display device has a structure in reverse to the structure depicted in FIG. 1.

Figure 2:
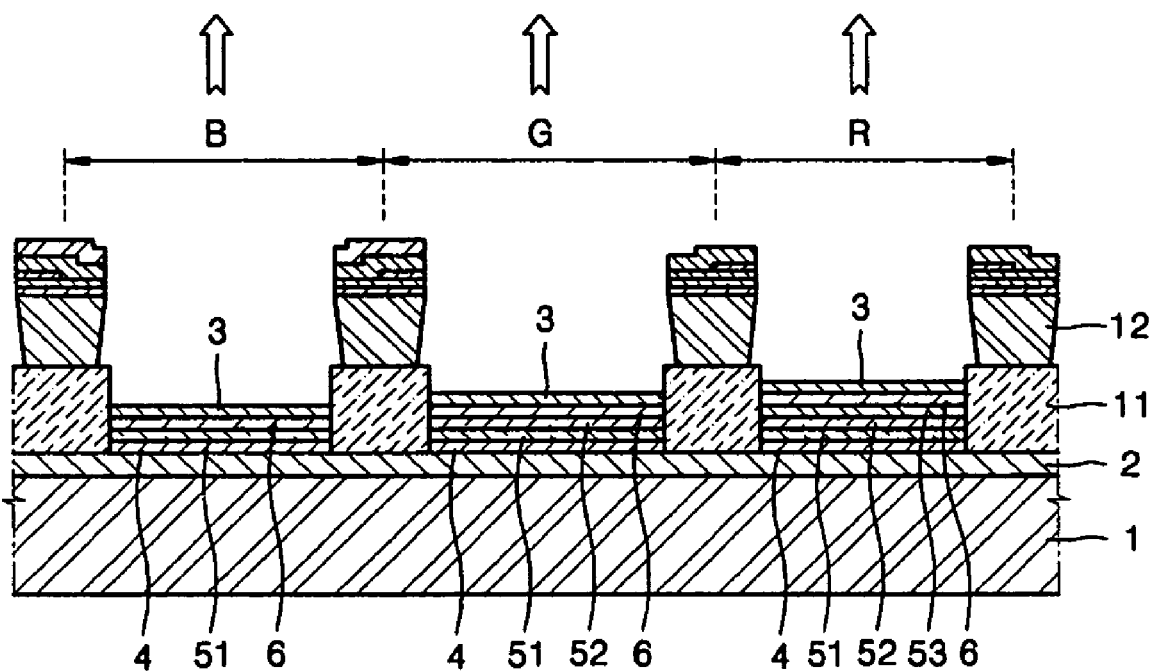
FIG. 2 is a cross-sectional view of a passive matrix (PM) top emission type organic light-emitting display device according to another embodiment.

FIG. 2 is a cross-sectional view of a PM type organic light-emitting display device according to an embodiment. The organic light-emitting display device in FIG. 2 is a top emission type organic light-emitting display device in which light is emitted as indicated by the arrows.

A first electrode layer 2 having a predetermined stripe pattern is formed on a substrate 1. Internal insulating films 11 that define the first electrode layer 2 in a lattice type are formed on the first electrode layer 2. Separators 12 are formed in a pattern crossing the first electrode layer 2 on the internal insulating film 11. The separators 12 can define blue B, green G and red R pixels, and a second electrode layer 3 can be readily patterned crossing the first electrode layer 2 by the separators 12.

In the illustrated embodiment, a first common layer 4 and a blue light-emitting layer 51 may be formed using a common mask. The first common layer 4 and the blue light-emitting layer 51 are formed in each of the blue B, green G and red R pixels. Next, a green light-emitting layer 52 is formed in the green G and red R pixels using a mask that shields the blue B pixel, and a red light-emitting layer 53 is formed in the red R pixel using a mask that shields the blue B and green B pixels. Afterward, a second common layer 6 and a second electrode layer 3 are formed covering the resultant product using a common mask. In this case, only three masks are required, thereby simplifying the manufacturing process.

Figure 3:
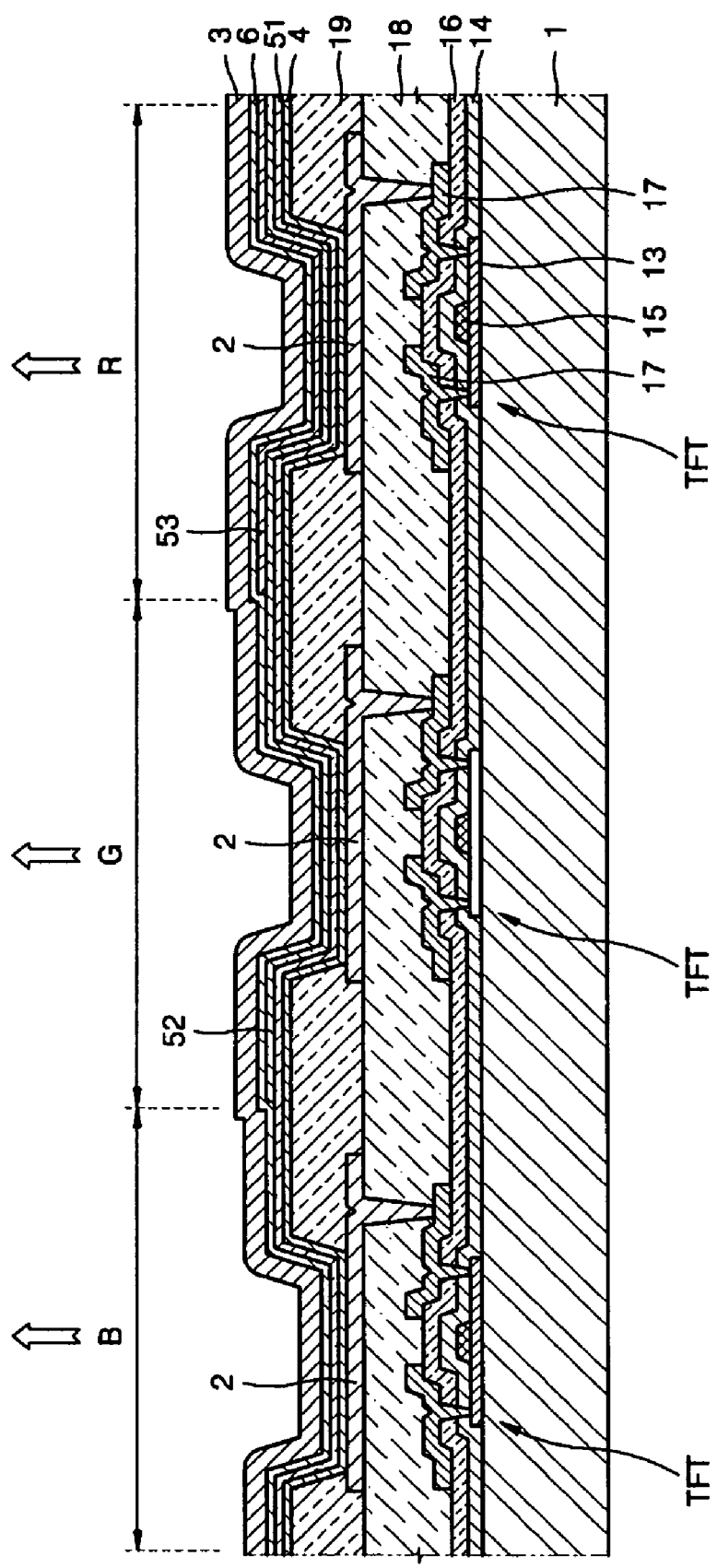
FIG. 3 is a cross-sectional view of an active matrix (AM) top emission type organic light-emitting display device according to another embodiment.

FIG. 3 is a cross-sectional view of an active matrix (AM) type organic light-emitting display device according to an embodiment. The organic light-emitting display device in FIG. 3 is a top emission type organic light-emitting display device in which light is emitted as indicated by the arrows, and each of blue B, green G and red R pixels includes at least one TFT on a substrate 1.

More specifically, as depicted in FIG. 3, a semiconductor active layer 13 is formed in a predetermined pattern on the substrate 1. A gate insulating film 14 formed of SiO2, SiNx, etc., is formed on the semiconductor active layer 13. A gate electrode 15 is formed in a predetermined region on the semiconductor active layer 13. The gate electrode 15 is connected to a gate line (not shown) that applies a TFT on/off signal. An interlayer insulating film 16 is formed above the gate electrode 15. Source and drain electrodes 17 are respectively connected to source and drain regions of the semiconductor active layer 13.

A first electrode of a capacitor (not shown) can be formed at the same time as the gate electrode 15. A second electrode of the capacitor can be formed at the same time as the source and drain electrodes 17. The skilled artisan will appreciate that various modifications of the structures of the TFT and capacitor can be used.

The TFT and the capacitor are protected by a passivation layer 18. The passivation layer 18 can be formed of an organic and/or inorganic material in a single or composite layer.

A first electrode layer 2, i.e., an anode electrode, is formed on the passivation layer 18. A pixel definition layer 19 formed of an organic material covering the first electrode layer 2 is formed. After forming predetermined openings in the pixel definition layer 19, light-emitting layers 51, 52, and 53 are formed in regions defined by the openings. Afterward, a second electrode 3 covering all of the pixels B, G and R is formed.

In the AM type structure as described above, after a first common layer 4 is formed, the blue light-emitting layer 51 is commonly formed in all of the pixels B, G, and R. Then, the green light-emitting layer 52 is formed in the green G and red R pixels. The red light-emitting layer 53 is formed in the red pixel R. A second common layer 6 covering all of the pixels B, G, and R is formed.

The embodiments described above can be applied to any flat panel display device that use LCDs or electron emission devices. In addition, although the embodiments described above, employ a deposition method using masks, any other suitable methods such as an inkjet or laser scanning method can also be used.

According to the embodiments, the fine patterning process of the light-emitting layers can be reduced, thereby simplifying the manufacturing process. Accordingly, the risk of misalignment is reduced, thereby resulting in high device characteristics such as color purity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
   an array of pixels comprising a first pixel, a second pixel and a third pixel;
   a first light-emitting layer common in the first, second and third pixels, the first light-emitting layer comprising a first light-emitting material;
   a second light-emitting layer common in the second and third pixels, the second light-emitting layer comprising a second light-emitting material differing from the first light-emitting material, wherein the first pixel does not comprise the second light-emitting layer; and
   a third light-emitting layer in the third pixel, the third light-emitting layer comprising a third light-emitting material differing from the first and second light-emitting materials, wherein the first and second pixels do not comprise the third light-emitting layer.

2. The device of claim 1, wherein in the third pixel, the second light-emitting layer is interposed between the first and third light-emitting layers.

3. The device of claim 1, wherein the second light-emitting layer contacts the first light-emitting layer, and wherein the third light-emitting layer contacts the second light-emitting layer.

4. The device of claim 1, wherein the first, second and third light-emitting materials are selected from the group consisting of blue (B), green (G) and red (R) light-emitting materials.

5. The device of claim 1, wherein the first pixel is configured to emit blue light, the second pixel is configured to emit green light, and the third pixel is configured to emit red light.

6. The device of claim 1, wherein each of the first, second and third pixels comprises an anode and a cathode.

7. The device of claim 6, wherein at least one of the anode and cathode is at least partially transparent.

8. The device of claim 6, wherein each of the first, second and third pixels further comprises at least one layer between the anode and the first light-emitting layer, and wherein the at least one layer is selected from the group consisting of a hole injection layer (HIL) and a hole transport layer (HTL).

9. The device of claim 6, wherein each of the first, second and third pixels further comprises at least one layer between the cathode and the first light-emitting layer, and wherein the at least one layer is selected from the group consisting of an electron injection layer (EIL) and an electron transport layer (ETL).

10. A method of emitting light, comprising:
    providing the organic light-emitting display device of claim 6;
    injecting holes from the anode toward the third light-emitting layer of the third pixel, wherein the holes travel through the first and second light-emitting layers to reach the third light-emitting layer of the third pixel;
    injecting electrons from the cathode toward the third light-emitting layer; and
    emitting light from the third light-emitting layer of the third pixel when the holes and electrons meet therein.

11. The method of claim 10, wherein the first, second and third light-emitting layers comprise blue (B), green (G) and red (R) light-emitting materials, respectively, and wherein light emitted from the third pixel is red.

12. The method of claim 10, further comprising:
    injecting holes from the anode toward the second light-emitting layer of the second pixel, wherein the holes travel through the first light-emitting layers to reach the second light-emitting layer of the second pixel;
    injecting electrons from the cathode toward the second light-emitting layer; and
    emitting light from the second light-emitting layer of the second pixel when the holes and electrons meet therein.

13. The method of claim 12, wherein the first and second light-emitting layers comprise blue (B) and green (G) light-emitting materials, respectively, and wherein light emitted from the second pixel is green.

* * * * *